United States Patent
Furui et al.

(10) Patent No.: US 8,564,082 B2
(45) Date of Patent: Oct. 22, 2013

(54) RADIATION DETECTOR

(75) Inventors: Shingo Furui, Higashiosaka (JP);
Toshinori Yoshimuta, Takatsuki (JP);
Junichi Suzuki, Kyoto (JP); Koji Watadani, Kyoto (JP); Satoru Morita, Takatsuki (JP)

(73) Assignee: Shimadzu Corporation, Kyoto (JP)

( * ) Notice: Subject to any disclaimer, the term of this patent is extended or adjusted under 35 U.S.C. 154(b) by 135 days.

(21) Appl. No.: 13/063,061

(22) PCT Filed: Sep. 10, 2008

(86) PCT No.: PCT/JP2008/066329
§ 371 (c)(1),
(2), (4) Date: Mar. 9, 2011

(87) PCT Pub. No.: WO2010/029617
PCT Pub. Date: Mar. 18, 2010

(65) Prior Publication Data
US 2011/0163306 A1    Jul. 7, 2011

(51) Int. Cl.
*H01L 27/22*   (2006.01)
*H01L 33/00*   (2010.01)

(52) U.S. Cl.
USPC .................. 257/427; 257/93; 257/E31.008

(58) Field of Classification Search
USPC .......................................................... 257/93
See application file for complete search history.

(56) References Cited

U.S. PATENT DOCUMENTS

| | | | |
|---|---|---|---|
| 6,635,860 B2 | 10/2003 | Sato et al. | |
| 7,875,856 B2 | 1/2011 | Sato et al. | |
| 2001/0035911 A1* | 11/2001 | Sato et al. | 348/374 |
| 2002/0148949 A1* | 10/2002 | Sato et al. | 250/214.1 |
| 2003/0127598 A1* | 7/2003 | Sato et al. | 250/370.01 |
| 2005/0051731 A1* | 3/2005 | Sato et al. | 250/370.01 |
| 2005/0170649 A1* | 8/2005 | Hirano | 438/689 |
| 2008/0203336 A1* | 8/2008 | Irisawa et al. | 250/591 |
| 2009/0050813 A1* | 2/2009 | Sato et al. | 250/370.01 |

FOREIGN PATENT DOCUMENTS

| | | |
|---|---|---|
| JP | 2002-311144 A | 10/2002 |
| WO | WO-2007/096967 A1 | 8/2007 |

OTHER PUBLICATIONS

Decision of Patentability for the Application No. 10-2011-7007778 from Korean Patent Office dated Jul. 17, 2012.

* cited by examiner

*Primary Examiner* — William D Coleman
*Assistant Examiner* — Igwe U Anya
(74) *Attorney, Agent, or Firm* — Cheng Law Group, PLLC

(57) ABSTRACT

A radiation detector of this invention has a curable synthetic resin film covering exposed surfaces of a radiation sensitive semiconductor layer, a carrier selective high resistance film and a common electrode, in which a material allowing no chloride to mix in is used in a manufacturing process of the curable synthetic resin film. This prevents pinholes and voids from being formed by chlorine ions in the carrier selective high resistance film and semiconductor layer. Also a protective film which does not transmit ionic materials may be provided between the exposed surface of the common electrode and the curable synthetic resin film, thereby to prevent the carrier selective high resistance film from being corroded by chlorine ions included in the curable synthetic resin film, and to prevent an increase of dark current flowing through the semiconductor layer.

16 Claims, 5 Drawing Sheets

RADIATION DETECTOR

TECHNICAL FIELD

This invention relates to a radiation detector for industrial or medical use, and more particularly to a construction of a radiation detector which converts radiation directly into carriers.

BACKGROUND ART

Conventionally, a direct conversion type radiation detector which converts radiation directly into carriers (charge information) in a semiconductor layer applies a predetermined bias voltage to a common electrode formed on a front surface of the semiconductor layer which is sensitive to radiation, and collects the carriers thereby generated in the semiconductor layer in pixel electrodes formed on a back surface of the semiconductor layer. Further, the carriers collected are read as radiation detection signals, using an active matrix substrate, thereby to detect the radiation.

Where an amorphous semiconductor layer such as a-Se (amorphous selenium), in particular, is used as the radiation sensitive semiconductor layer, a large and thick semiconductor layer can be formed easily by a method such as vacuum vapor deposition. Thus, the amorphous semiconductor layer can be constructed as a radiation conversion layer of a two-dimensional array type radiation detector.

Since the direct conversion type radiation detector applies a high voltage to the common electrode, a discharge occurs along the surface of the amorphous semiconductor layer. In order to solve the problem of this creeping discharge, in Patent Document 1 and in FIG. 4, entire surfaces of an amorphous semiconductor layer 44, a common electrode 42 and a carrier selective high resistance film 43 are covered with a curable synthetic resin film 53 (epoxy resin) acting as an insulating layer of high withstand voltage.

Further, Patent Document 1 also indicates a problem that solvent components of the epoxy resin react with a-Se forming the amorphous semiconductor layer 44, to discolor the surface of the amorphous semiconductor layer 44, and lower the withstand voltage. So, the entire surface of the amorphous semiconductor layer 44 is covered with the solvent-resistant and carrier selective high resistance film 43 such as $Sb_2S_3$ film, to reduce the reaction between the solvent components of the epoxy resin and a-Se and to prevent discoloration of the surface of the amorphous semiconductor layer 44 and lowering of the withstand voltage.

In order to avoid warpage and cracking of the radiation detector 40, the curable synthetic resin film 53 of high withstand voltage is fixed as pinched between an insulating substrate 51 and an insulating auxiliary plate 54 with a thermal expansion coefficient comparable to that of the insulating substrate 51.

[Patent Document 1]
Unexamined Patent Publication No. 2002-311144

DISCLOSURE OF THE INVENTION

Problem to be Solved by the Invention

However, a new problem not disclosed in the above Patent Document 1 has been found. That is, as the above radiation detector 40 continues to be used, electric charges accumulate on opposite surfaces to facing surfaces of the auxiliary plate 54 (glass) and curable synthetic resin film 53, i.e. radiation incidence surfaces. The static electricity due to these accumulated charges affects radiation detection signals read from the active matrix substrate 52, to produce noise in the radiation detection signals.

Then, the accumulation of electric charges is prevented to inhibit generation of static electricity by grounding the radiation incidence surface of the auxiliary plate 54. This has removed the noise generated in the radiation detection signals. However, a further problem has arisen here. It is a problem of increased defective pixels due to an increase of dark current.

When the solvent-resistant and carrier selective high resistance film 43 covering the entire surface of the amorphous semiconductor layer 44 is observed with an electron microscope, pinholes as shown in FIG. 5 have newly been confirmed. It has also newly been confirmed that through these pinholes voids are formed in the surface of the amorphous semiconductor layer 44.

This invention has been made having regard to the state of the art noted above, and its object is to provide a radiation detector which prevents void formation and pinhole formation in an amorphous semiconductor layer and a carrier selective high resistance film, without accumulating electric charges on an auxiliary plate.

Means for Solving the Problem

Inventor herein has made intensive research and attained the following findings. First, in order to determine what substances form the voids and pinholes in the amorphous semiconductor layer 44 and carrier selective high resistance film 43, an element specifying inspection was conducted with an X-ray fluorescence spectrometer for void portions and pinhole portions as well as other portions of the amorphous semiconductor layer 44 and carrier selective high resistance film 43. FIG. 6 shows elements detected from the void portions and pinhole portions. FIG. 7 shows elements detected in portions without the voids and pinholes. As a result, chlorine atoms (Cl) which should not be found have been detected from the void portions and pinhole portions. Further, an investigation was made as to why the chlorine atoms exist, and it has newly been found that they remained as a byproduct having failed to be removed when preparing an epoxy prepolymer which is the base resin of the epoxy resin.

The base resin of the epoxy resin is an epoxy prepolymer which is a mixture of bisphenol A ($C_{15}H_{16}O_2$) and epichlorohydrin ($C_3H_5ClO$). This epoxy prepolymer has chlorine ions ($Cl^-$) of epichlorohydrin remaining therein as a byproduct without being removed. Then, the residual concentration of chlorine ions in the epoxy prepolymer used in this application was measured, and it was about 400-1000 ppm.

It has been found that, for the above reason, chlorine ions remain also in the epoxy resin formed by mixing the epoxy prepolymer and curing agent, and that pinholes are formed by this chlorine corroding the $Sb_2S_3$ film which is the carrier selective high resistance film 43. Penetrated by the pinholes, the $Sb_2S_3$ film has a reduced function as the carrier selecting film. This increases dark current and increases defective pixels. The chlorine passes through these pinholes to corrode the surface of the amorphous semiconductor layer 1 and form voids.

Grounding the auxiliary plate 54 is also considered one of the causes of the chlorine forming the pinholes in the $Sb_2S_3$ film which is the carrier selective high resistance film 43. Comparing the case of grounding the auxiliary plate 54 and the case of not grounding the auxiliary plate 54, field intensity from the common electrode 42 toward the auxiliary plate 54 is stronger in the case of grounding the auxiliary plate 54 when a positive bias voltage is applied to the common electrode 42. This is considered to cause the chlorine ions in the epoxy resin to be drawn strongly to this electric field to concentrate near the common electrode 42, whereby this chlorine corrodes the $Sb_2S_3$ film and amorphous semiconductor layer 1.

Then, a radiation detector has been invented, which prevents void formation and pinhole formation in the amorphous semiconductor layer 44 and carrier selective high resistance film 43, without accumulating electric charges on the auxiliary plate 54.

To fulfill the above object, this invention provides the following construction.

A radiation detector in a first aspect of this invention comprises a radiation sensitive semiconductor layer for generating carriers upon incidence of radiation; a high resistance film formed on an incidence surface of the semiconductor layer for selecting and transmitting the carriers; a common electrode formed on an incidence surface of the high resistance film for applying a bias voltage to the high resistance film and the semiconductor layer; a matrix substrate formed on a surface opposite to the incidence surface of the semiconductor layer for reading, on a pixel-by-pixel basis, radiation detection signals from the carriers generated in the semiconductor layer; a curable synthetic resin film covering entire exposed surfaces of the semiconductor layer, the high resistance film and the common electrode; and an auxiliary plate fixed to an incidence surface of the curable synthetic resin film; wherein the auxiliary plate has a conductive and grounded surface opposite to a surface facing the curable synthetic resin film; and the curable synthetic resin film does not involve, as a raw material therefor, chlorine or a compound which includes chlorine.

According to the radiation detector in the first aspect of the invention, the auxiliary plate is grounded to prohibit accumulation of charges on the auxiliary plate. Consequently, noise is not generated in the radiation detection signals read on a pixel-by-pixel basis from the matrix substrate. The intensity of an electric field in the curable synthetic resin film increases due to the grounding of the auxiliary plate. However, since the curable synthetic resin film does not involve chlorine or a compound which includes chlorine as a raw material in its manufacturing process, chlorine does not remain as a byproduct in the curable synthetic resin film, so that the high resistance film is not corroded. Consequently, there occurs little increase of dark current since few pinholes is formed in the high resistance film. There is little possibility of the semiconductor layer becoming corroded to form voids. Thus, the radiation detector can be manufactured, which inhibits an increase of dark current while inhibiting generation of noise in the radiation detection signals.

The above radiation detector may use a urethane resin or an acrylic resin for the curable synthetic resin film. These resins do not involve chlorine or a compound which includes chlorine as a raw material in their manufacturing process, and therefore few pinholes is formed in the high resistance film.

In the above radiation detector, the bias voltage applied to the common electrode, preferably, is a positive bias voltage. This improves detection accuracy of the radiation detection signals.

In the above radiation detector, the matrix substrate may be an active matrix substrate including pixel electrodes for collecting, on a pixel-by-pixel basis, the carriers generated in the semiconductor layer; capacitors for storing charges corresponding to a number to the carriers collected; switching elements for reading the charges stored; and electrode wires arranged in a grid form, and connected to the switching elements located at grid points. This enables manufacture of a radiation detector having a large screen, and yet little influence of crosstalk.

In the above radiation detector, the semiconductor layer may be amorphous selenium. With amorphous selenium, a radiation detector of large area can be manufactured easily.

A radiation detector in a second aspect of this invention comprises a radiation sensitive semiconductor layer for generating carriers upon incidence of radiation; a high resistance film formed on an incidence surface of the semiconductor layer for selecting and transmitting the carriers; a common electrode formed on an incidence surface of the high resistance film for applying a bias voltage to the high resistance film and the semiconductor layer; a matrix substrate formed on a surface opposite to the incidence surface of the semiconductor layer for reading, on a pixel-by-pixel basis, radiation detection signals from the carriers generated in the semiconductor layer; a protective film covering entire exposed surfaces of the semiconductor layer, the high resistance film and the common electrode to prevent transmission of ionic materials; a curable synthetic resin film covering an entire surface of the protective film; and an auxiliary plate fixed to an incidence surface of the curable synthetic resin film; wherein the auxiliary plate has a conductive and grounded surface opposite to a surface facing the curable synthetic resin film.

According to the radiation detector in the second aspect of the invention, the auxiliary plate is grounded to prohibit accumulation of charges on the auxiliary plate. Consequently, noise is not generated in the radiation detection signals read on a pixel-by-pixel basis from the matrix substrate. Further, the protective film covering entire exposed surfaces of the semiconductor layer, the high resistance film and the common electrode prevents transmission of ionic materials. Thus, even if chlorine ions were present in the curable synthetic resin film, the chlorine ions would be unable to pass through the protective film. The high resistance film is not corroded, and few pinholes is formed. Consequently, there occurs little increase of dark current since few pinholes is formed in the high resistance film. There is little possibility of the semiconductor layer becoming corroded to form voids. Thus, the radiation detector can be manufactured, which inhibits an increase of dark current while inhibiting generation of noise in the radiation detection signals.

A SiN film may be formed as the protective film. A SiN film will not transmit ionic materials. Further, a barrier layer may be cured at a temperature below 40° C., which will not crystallize the semiconductor layer having an amorphous structure.

The curable synthetic resin film may be an epoxy resin including chlorine ions as impurities, or may be a urethane resin or an acrylic resin which does not involve chlorine or a compound which includes chlorine, as a raw material in its manufacturing process.

Effects of the Invention

With the radiation detector according to this invention, no electric charges accumulate on the auxiliary plate, and therefore noise is not generated in the radiation detection signals read on a pixel-by-pixel basis from the matrix substrate. This also prevents void formation and pinhole formation in the amorphous semiconductor layer and carrier selective high resistance film. Thus, the radiation detector provided is free from an increase of dark current.

DESCRIPTION OF REFERENCES

Figure 1:
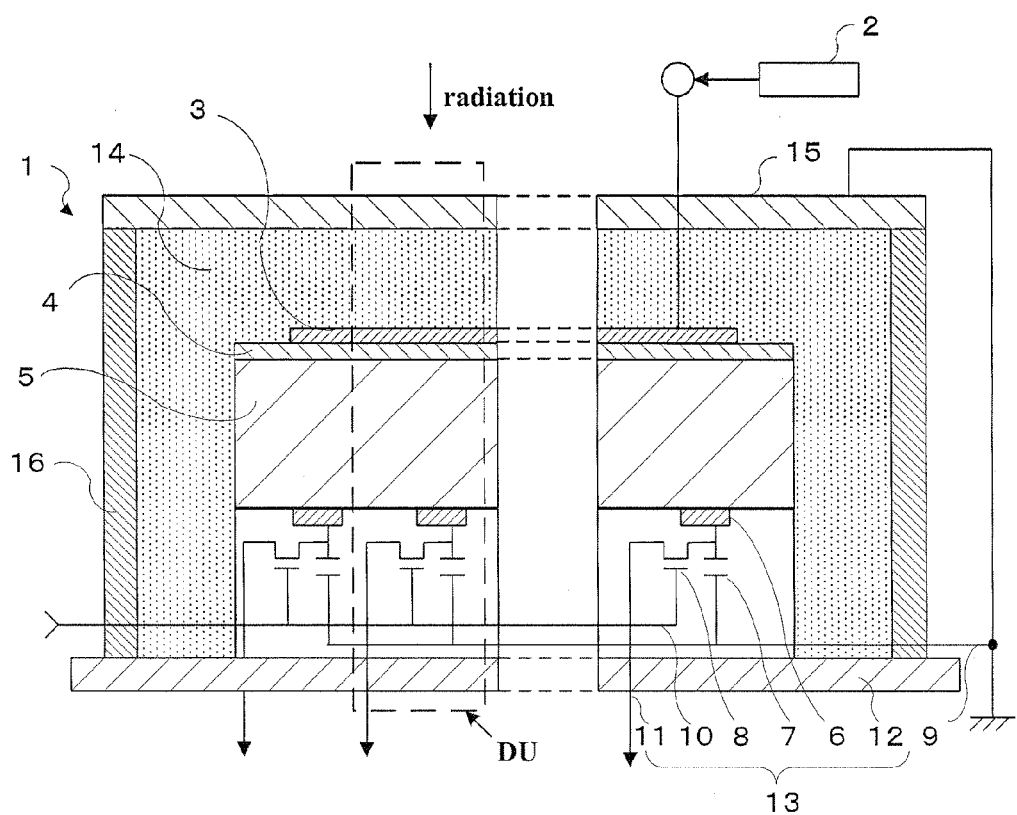
FIG. 1 is a schematic view in vertical section showing a construction of a radiation detector according to Embodiment 1.

1 . . . radiation detector
2 . . . bias voltage source
3 . . . common electrode
4 . . . carrier selective high resistance film
5 . . . amorphous semiconductor layer
6 . . . pixel electrodes
7 . . . carrier storage capacitors
8 . . . switching elements
9 . . . ground lines
10 . . . gate lines
11 . . . data lines
12 . . . insulating substrate
13 . . . active matrix substrate
14 . . . curable synthetic resin film
15 . . . auxiliary plate
31 . . . protective film
DU . . . detecting elements Embodiment 1

Embodiment 1 of this invention will be described hereinafter with reference to the drawings.

Figure 2:
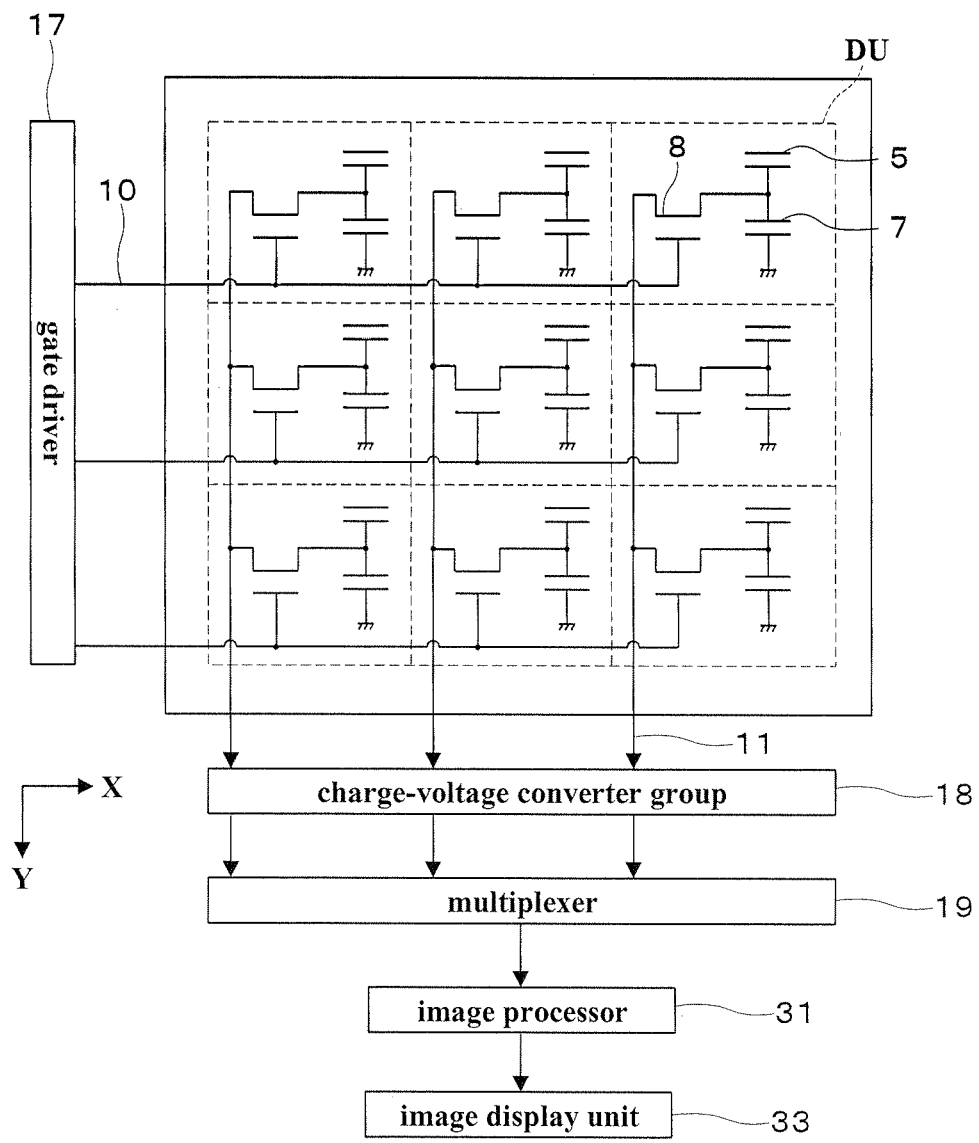
FIG. 2 is a circuit diagram showing a construction of an active matrix substrate and peripheral circuits according to Embodiment 1.

FIG. 1 is a schematic view in vertical section showing a construction of a radiation detector according to Embodiment 1. FIG. 2 is a circuit diagram showing a construction of a radiographic apparatus including peripheral circuits electrically connected to an active matrix substrate in the radiation detector.

As shown in FIG. 1, the radiation detector 1 in Embodiment 1 has, formed under a common electrode 3 to which a positive bias voltage is applied from a bias voltage source 2, a carrier selective high resistance film 4 which selects and transmits carriers. Formed still thereunder is an amorphous semiconductor layer 5 which generates carriers (electron-hole pairs) upon incidence of radiation. That is, as a positive bias voltage is applied to the common electrode 3, the positive bias voltage is applied to the carrier selective high resistance film 4 and amorphous semiconductor layer 5. Formed under the amorphous semiconductor layer 5 is an active matrix substrate 13 which includes pixel electrodes 6 for collecting the carriers on a pixel-by-pixel basis, carrier storage capacitors 7 for storing the carriers collected by the pixel electrodes 6, switching elements 8 and ground lines 9 electrically connected to the carrier storage capacitors 7, gate lines 10 for sending signals for switching action to the switching elements 8, data lines 11 for reading, through the switching elements 8, and as radiation detection signals, electric charges stored in the carrier storage capacitors 7, and an insulating substrate 12 for supporting these components. This active matrix substrate 13 can read, on a pixel-by-pixel basis, the radiation detection signals from the carriers generated in the amorphous semiconductor layer 5. The amorphous semiconductor layer 5 corresponds to the radiation sensitive semiconductor layer in this invention. The carrier selective high resistance film 4 corresponds to the high resistance film in this invention. The gate lines 10 and data lines 11 correspond to the electrode wires in this invention. The active matrix substrate 13 corresponds to the matrix substrate in this invention.

And a curable synthetic resin film 14 is formed to cover all of the common electrode 3, carrier selective high resistance film 4 and amorphous semiconductor layer 5 from the insulating substrate 12 of the active matrix substrate 13. An auxiliary plate 15 is formed on an upper surface of the curable synthetic resin film 14.

The amorphous semiconductor layer 5 is a high purity a-Se thick film with a specific resistance of $10^9$ Ωcm or more (preferably, $10^{11}$ Ωcm or more), and a thickness of 0.5 mm to 1.5 mm. This a-Se thick film can, in particular, facilitate enlargement of a detecting area. If the amorphous semiconductor layer 5 were thin, radiation would be transmitted without being converted. Thus, the thick film of 0.5 mm to 1.5 m is used.

The common electrode 3 and pixel electrodes 6 are formed of metal, such as Au, Pt, Ni or In, or ITO. Of course, the material for the amorphous semiconductor layer 5 and the material for the electrodes are not limited to the examples given above.

The carrier selective high resistance film 4 employed is a film with high hole injection blocking capability since a positive bias is applied as the bias voltage. The specific resistance of the high resistance film 4, preferably, is $10^9$ Ωcm or more. An appropriate thickness of the high resistance film 4 is 0.1 µm to 5 µm. Generally, when used for a positive bias, an n-type (majority carriers being electrons) selective film is considered desirable as the carrier selective high resistance film 4. However, since the general rule may not necessarily be valid in a high resistance domain of $10^9$ Ωcm or more, it can be effective to use a p-type layer for a positive bias. An n-type layer is exemplified by CdS or ZnS. A p-type layer is exemplified by $Sb_2Te_3$, $Sb_2S_3$ or ZnTe. In Embodiment 1, $Sb_2S_3$ is employed as the carrier selective high resistance film 4.

The auxiliary plate 15 with a thermal expansion coefficient comparable to that of the insulating substrate 12, preferably, has a high radiation transmittance, and quartz glass is used, for example. An appropriate thickness thereof is 0.5 mm to 1.5 mm. The auxiliary plate 15 has a radiation incidence surface coated with conductive carbon particulates, for example, and thus the radiation incidence surface of the auxiliary plate 15 is conductive. Further, since this radiation incidence surface of the auxiliary plate 15 is grounded, electric charges will not accumulate on opposite surfaces to facing surfaces of the auxiliary plate 15 and curable synthetic resin film 14, i.e. radiation incidence surfaces.

In this embodiment, a urethane resin is employed as the curable synthetic resin film 14 of high withstand voltage. This is because, in the case of a urethane resin, chlorine or a compound which includes chlorine is not used as a material in the manufacturing process of the resin, and thus no chlorine remains as a byproduct of the urethane resin. When curing the urethane resin, it can be cured at normal temperature below 40° C. and will not crystallize a-Se. When a different resin is selected as the curable synthetic resin film 14, an upper limit of curing temperature is determined by the type of semiconductor employed as the semiconductor layer 5. When a-Se is used as noted above, since a-Se is easily crystallized by heat, it is necessary to select a synthetic resin of the type that cures at normal temperature below 40° C.

The formation thickness of these curable synthetic resin films 14, considering that, when it is too thin, the withstand voltage will lower, and when too thick, incident radiation will attenuate, is selected to provide a gap of 1 mm to 5 mm, preferably 2 mm to 4 mm, between the insulating substrate 12 and auxiliary plate 15. In order to form this gap reliably, a spacer 16 formed of ABS resin or the like is provided peripherally of the insulating substrate 12. The gap can be adjusted by providing the spacer 16 between the auxiliary plate 15 and active matrix substrate 13 in this way.

Numerous pixel electrodes 6 are formed in a two-dimensional array, one carrier storage capacitor 7 is provided for storing carriers collected by each pixel electrode 6, and one switching element 8 for reading the carriers. Thus, the radiation detector 1 in this embodiment serves as a flat panel radiation sensor of two-dimensional array construction with numerous detecting elements DU which are radiation detection pixels arranged along X- and Y-directions (see FIG. 2). This allows local radiation detection to be made for each radiation detection element, thereby enabling measurement of a two-dimensional distribution of radiation intensities.

The gates of thin-film transistors (TFTs) which cause switching of the switching elements 8 of the detecting elements DU are connected to the gate lines 10 in the horizontal (X) direction, while the drains of the thin-film transistors are connected to the data lines 11 in the vertical (Y) direction.

And, as shown in FIG. 2, the gate lines 10 are connected to a gate driver 17, and the data lines 11 are connected to a multiplexer 19 through a charge-voltage converter group 18. The detecting elements DU of the radiation sensor are identified based on addresses assigned to the respective detecting elements DU in order along the arrangements in the X- and Y-directions. Therefore, scan signals for signal fetching serve as signals designating the addresses in the X-direction or the addresses in the Y-direction, respectively. Although FIG. 2 shows a matrix construction for 3×3 pixels for expediency of illustration, the active matrix substrate 13 in use actually has a size matched to the number of pixels of the radiation detector 1.

The detecting elements DU are selected on a row-by-row basis as the gate driver 17 applies a fetching voltage to the gate lines 10 in the X-direction in response to the scan signals in the Y-direction. And with the multiplexer 19 switched by the scan signals in the X-direction, the charges stored in the carrier storage capacitors 14 of the detecting elements DU in the selected rows will be sent out successively through the charge-voltage converter group 27 and multiplexer 19.

Specifically, a radiation detecting operation by the radiation detector 1 in this embodiment is as follows. Upon incidence of radiation to be detected in the state of the bias voltage applied to the common electrode 3 on the front surface of the amorphous semiconductor layer 5, carriers (electron-hole pairs) generated by incidence of the radiation move due to the electric field formed by the positive bias voltage, such that electrons move toward the common electrode 3 and holes toward the pixel electrodes 6. Charges corresponding to the number of carriers generated are stored in the carrier storage capacitors 7 adjacent the pixel electrodes 6. As the carrier readout switching elements 8 are changed to ON sate, the charges stored are read as radiation detection signals via the switching elements 8, to be converted into voltage signals by the charge-voltage converter group 18.

Where the radiation detector 1 in this embodiment is used as an X-ray detector of an X-ray fluoroscopic apparatus, for example, after the detection signals of the detecting elements DU are fetched in order as pixel signals from the multiplexer 19, required signal processing such as a noise process is carried out by an image processor 20, and then a two-dimensional image (X-ray fluoroscopic image) is displayed on an image display unit 21.

In manufacturing the radiation detector 1 in this embodiment, thin-film transistors for the switching elements 8, carrier storage capacitors 7, pixel electrodes 6, carrier selective high resistance film 4, amorphous semiconductor layer 5, carrier selective high resistance film 4 and common electrode 3 are laminated and formed in order on the surface of the insulating substrate 12, using a thin film forming technique by varied vacuum film formation method or a patterning technique by photolithographic method.

In the radiation detector 1 constructed as described above, the surface of the auxiliary plate 15 is conductive and is grounded. Therefore, electric charges are not accumulated on the auxiliary plate 15. Consequently, noise is not generated in the radiation detection signals read from the active matrix substrate 13. The curable synthetic resin film 14 does not involve chlorine or a compound which includes chlorine as a raw material in its manufacturing process. Therefore, even if the intensity of an electric field in the curable synthetic resin film 14 increases due to the grounding of the auxiliary plate 15, the carrier selective high resistance film 4 is not easily corroded by chlorine ions. Consequently, no pinhole is formed in the carrier selective high resistance film 4, and no void is formed in the amorphous semiconductor layer 5, either. Since no pinhole is formed in the carrier selective high resistance film 4, the function of the carrier selective high resistance film 4 as the hole blocking layer is not impaired. Consequently, there occurs no increase of dark current.

Since a normal temperature curing type urethane resin is used for the curable synthetic resin film 14, the amorphous semiconductor layer 5 will not be crystallized when the curable synthetic resin film 14 is cured.

Embodiment 2

Figure 3:
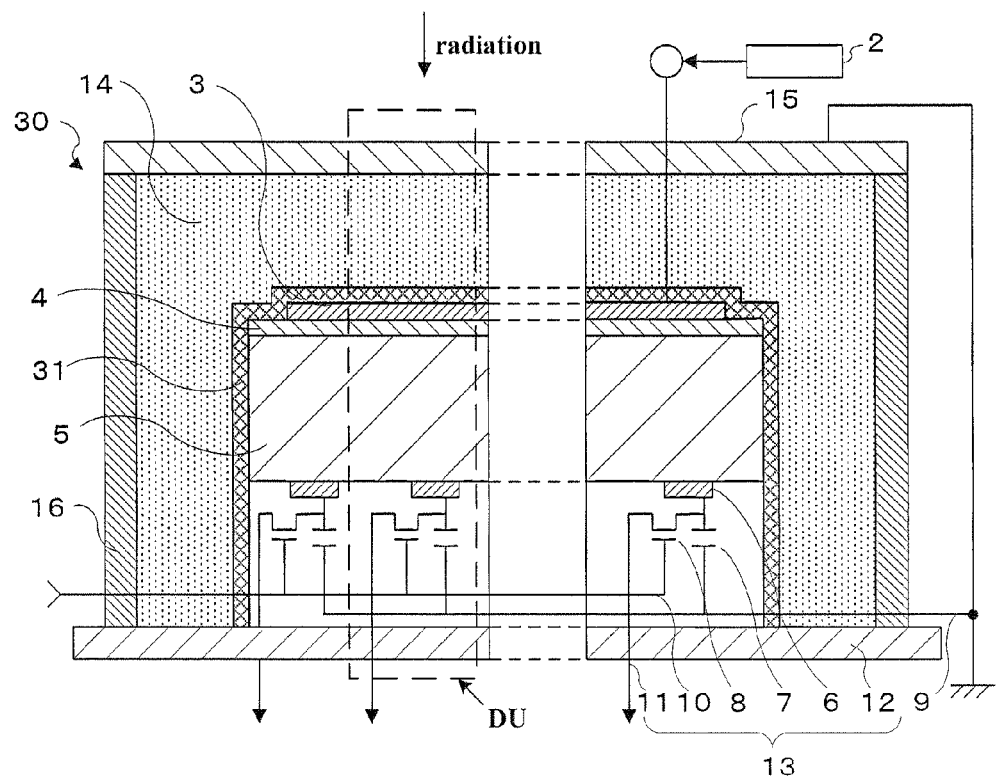
FIG. 3 is a schematic view in vertical section showing a construction of a radiation detector according to Embodiment 2.
Figure 4:
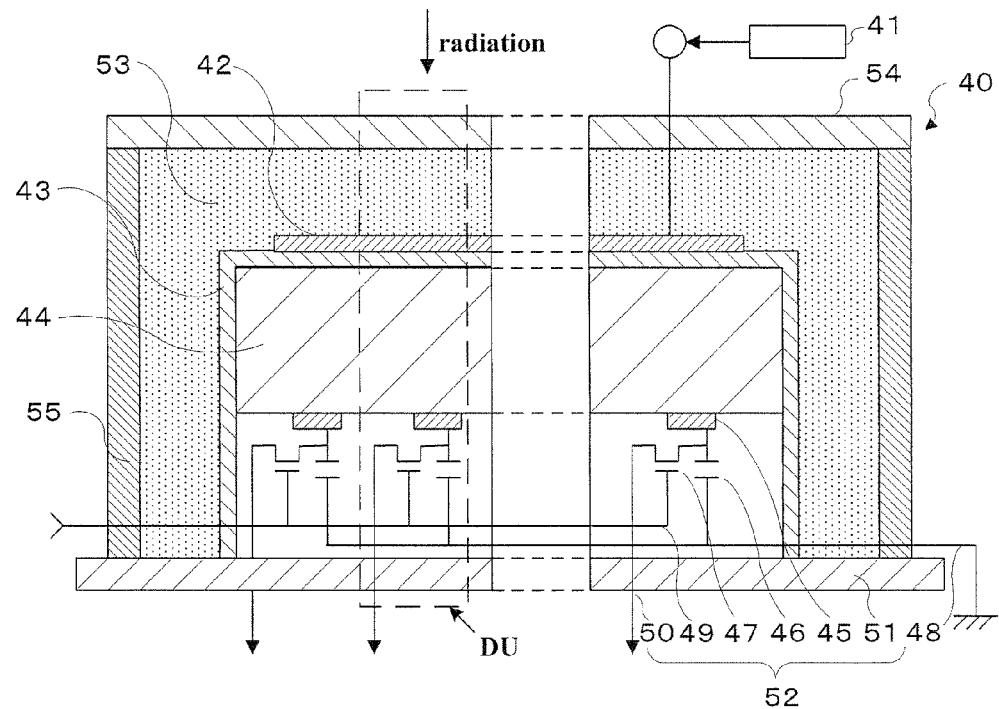
FIG. 4 is a schematic view in vertical section showing a construction of a radiation detector according to the prior art.
Figure 5:
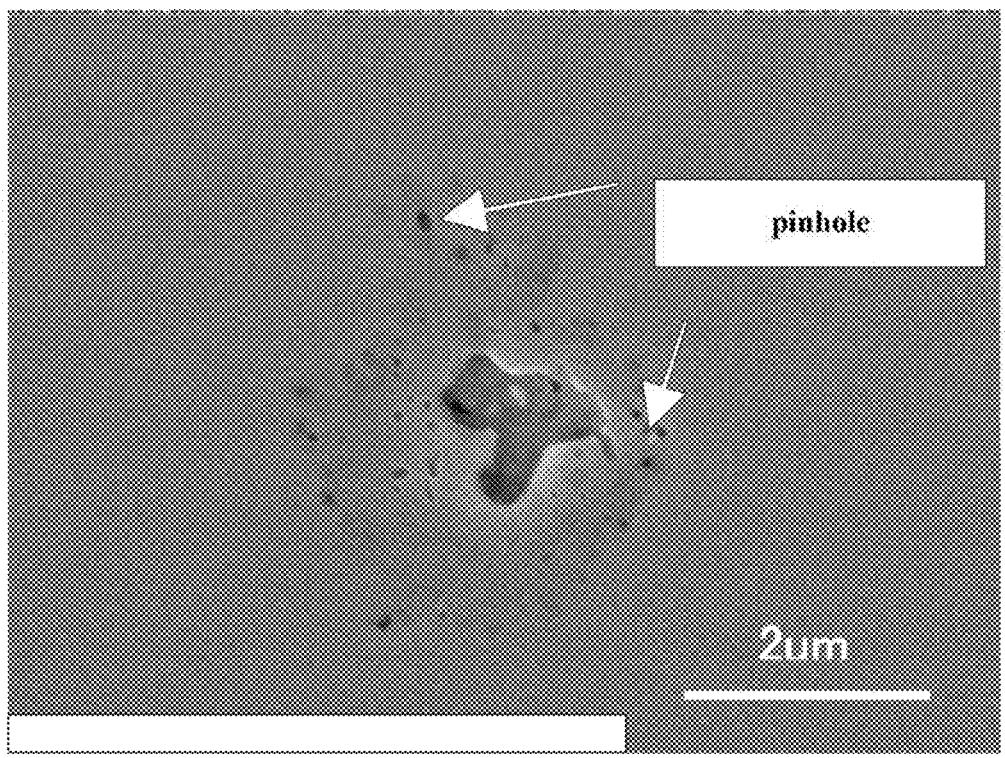
FIG. 5 is an electron micrographic view showing a carrier selective high resistance film of the radiation detector according to the prior art.
Figure 6:
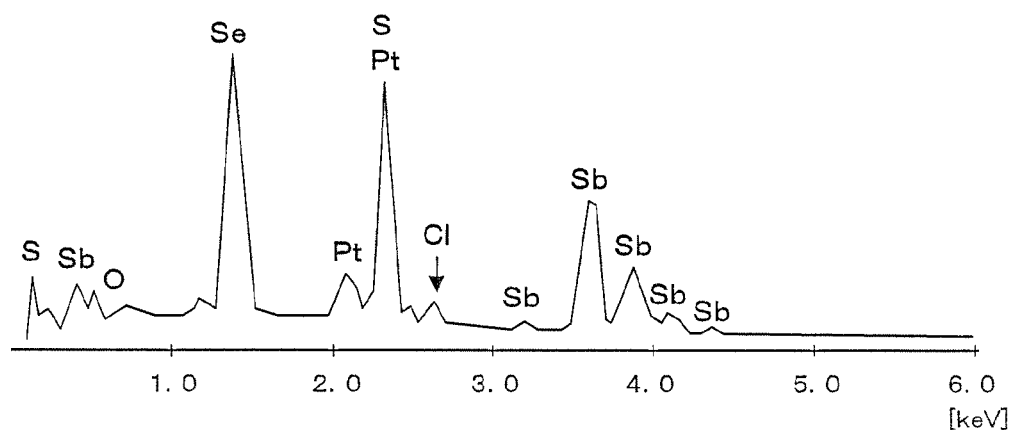
FIG. 6 is an explanatory view showing elements detected from the carrier selective high resistance film of the radiation detector according to the prior art.
Figure 7:
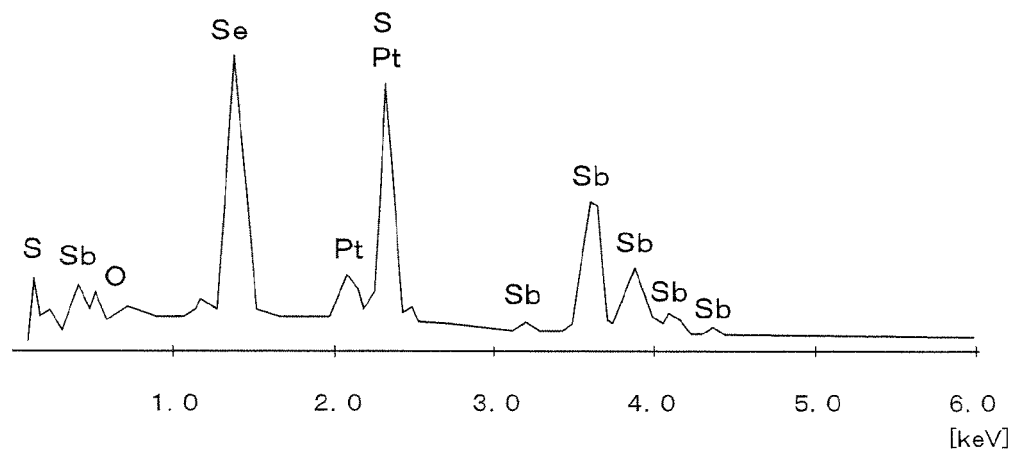
FIG. 7 is an explanatory view showing elements detected from the carrier selective high resistance film of the radiation detector according to the prior art.

Embodiment 2 of this invention will be described hereinafter with reference to FIG. 3. FIG. 3 is a schematic view in vertical section showing a construction of a radiation detector according to Embodiment 2. Components similar to those in Embodiment 1 are affixed with common signs.

In Embodiment 2, a protective film 31 is formed to cover entire surfaces of the common electrode 3, carrier selective high resistance film 4 and amorphous semiconductor layer 5. And the curable synthetic resin film 14 is further formed to cover the protective film 31.

The protective film 31 is made of a material having a property not to transmit ionic materials. Conventional organic film such as a curable synthetic resin film transmits ionic materials, and therefore SiN film, for example, is suitable for the protective film 31. SiN is laminated by CVD method at normal temperature below 40° C. According to this construction, even if chlorine ions mix as impurities into the curable synthetic resin film 14, the protective film 31 prevents corrosion by the chlorine ions of the carrier selective high resistance film 4 and amorphous semiconductor layer 5, thereby to prevent formation of pinholes and voids.

The protective film 31 permits chlorine ions to remain as a byproduct in the curable synthetic resin film 14, which provides an extended range for selecting materials. For example, a conventional epoxy resin can be used as the curable synthetic resin film 14.

In the radiation detector 1 constructed as described above, the protective film 31 is formed between entire exposed surfaces of the amorphous semiconductor layer 5, carrier selective high resistance film 4 and common electrode 3 and the curable synthetic resin film 14. Thus, the carrier selective high resistance film 4 and amorphous semiconductor layer 5 are protected against corrosion by chlorine from the curable synthetic resin film 14, whereby no pinhole or void is formed. Consequently, the function of the carrier selective high resistance film 4 as the hole blocking layer is not impaired, thereby to inhibit an increase of dark current.

This invention is not limited to the foregoing embodiments, but may be modified as follows:

(1) The auxiliary plate 15 is grounded in the foregoing embodiments, but may instead be maintained at a certain constant positive potential lower than the potential of the positive bias voltage applied. If the auxiliary plate 15 is maintained at the constant positive potential, noise will not occur to the radiation detection signals read from the active matrix substrate 13. Compared with the case of grounding the auxiliary plate 15, the field intensity from the common electrode 3 toward the auxiliary plate 15 is eased, and the time for chlorine ions to move toward the common electrode 3 is delayed, whereby pinholes become less likely to be formed in the carrier selective high resistance film 4.

(2) In the foregoing embodiments, a urethane resin is employed as the curable synthetic resin film 14. An acrylic resin may be employed instead. This is because an acrylic resin does not involve chlorine or a compound which includes chlorine as a raw material in a manufacturing process of the resin, and thus no chlorine remains as a byproduct of the urethane resin. When curing the acrylic resin, it can be cured at normal temperature below 40° C. and will not crystallize a-Se. For the same reasons, a photo-curing type acrylic resin may be employed.

(3) In the foregoing embodiments, the active matrix substrate 16 is employed as matrix substrate. A passive matrix substrate may be employed instead.

The invention claimed is:

1. A radiation detector comprising:
    a radiation sensitive semiconductor layer for generating carriers upon incidence of radiation;
    a high resistance film formed on an incidence surface of the semiconductor layer for selecting and transmitting the carriers;
    a common electrode formed on an incidence surface of the high resistance film applying a bias voltage to the high resistance film and the semiconductor layer;
    a matrix substrate formed on a surface opposite to the incidence surface of the semiconductor layer for reading, on a pixel-by-pixel basis, radiation detection signals from the carriers generated in the semiconductor layer;
    a curable synthetic resin film covering entire exposed surfaces of the semiconductor layer, the high resistance film and the common electrode; and
    an auxiliary plate fixed to an incidence surface of the curable synthetic resin film;
    wherein the auxiliary plate has a conductive and grounded surface opposite to a surface facing the curable synthetic resin film; and
    the curable synthetic resin film does not involve, as a raw material thereof, chlorine or a compound which includes chlorine.

2. The radiation detector according to claim 1, wherein the curable synthetic resin film is a urethane resin or an acrylic resin.

3. The radiation detector according to claim 2, wherein the bias voltage applied to the common electrode is a positive bias voltage.

4. The radiation detector according to claim 1, wherein the bias voltage applied to the common electrode is a positive bias voltage.

5. The radiation detector according to claim 1, wherein the matrix substrate is an active matrix substrate including:
    pixel electrodes for collecting, on a pixel-by-pixel basis, the carriers generated in the semiconductor layer;
    capacitors for storing charges corresponding to a number of the carriers collected by the pixel electrodes;
    switching elements for reading the charges stored; and
    electrode wires arranged in a grid form, and connected to the switching elements located at grid points.

6. The radiation detector according, to claim 1, wherein the semiconductor layer is amorphous selenium.

7. A radiation detector comprising:
    a radiation sensitive semiconductor layer for generating carriers upon incidence of radiation;
    a high resistance film formed on an incidence surface of the semiconductor layer for selecting and transmitting the carriers;
    a common electrode formed on an incidence surface at the high resistance film for applying a bias voltage to the high resistance film and the semiconductor layer;
    a matrix substrate farmed on a surface opposite to the incidence surface of the semiconductor layer for reading, on a pixel-by-pixel basis, radiation detection signals from the carriers generated in the semiconductor layer;
    a protective film covering entire exposed surfaces of the semiconductor layer, the high resistance film and the common electrode to prevent transmission of ionic materials;
    a curable synthetic resin film covering an entire surface of the protective film; and
    an auxiliary plate fixed to an incidence surface of the curable synthetic resin film;
    wherein the auxiliary plate has a conductive and grounded surface opposite to a surface facing the curable synthetic resin film.

8. The radiation detector according to claim 7, wherein the protective film is SiN film.

9. The radiation detector according to claim 8, wherein the protective film is formed at a temperature below 40'C.

10. The radiation detector according to claim 7, wherein the protective film is formed at a temperature below 40'C.

11. The radiation detector according to claim 7, wherein the curable synthetic resin film is an epoxy resin.

12. The radiation detector according to claim 7, wherein the curable synthetic resin film does not involve, as a raw material thereof, chlorine or a compound which includes chlorine.

13. The radiation detector according, to claim 12, wherein the curable synthetic resin film is a urethane resin or an acrylic resin.

14. The radiation detector according to claim 7, wherein the bias voltage applied to the common electrode is a positive bias voltage.

15. The radiation detector according to claim 7, wherein the matrix substrate is an active matrix substrate including:
    pixel electrodes for collecting, on a pixel-by-pixel basis, the carriers generated in the semiconductor layer;
    capacitors for storing charges corresponding to a number of the carriers collected by the pixel electrodes;
    switching elements for reading the charges stored; and electrode wires arranged in a grid form, and connected to the switching elements located at grid points.

16. The radiation detector according to claim 7, wherein the semiconductor layer is amorphous selenium.

* * * * *